(12) United States Patent
Colburn et al.

(10) Patent No.: US 7,030,495 B2
(45) Date of Patent: Apr. 18, 2006

(54) METHOD FOR FABRICATING A SELF-ALIGNED NANOCOLUMNAR AIRBRIDGE AND STRUCTURE PRODUCED THEREBY

(75) Inventors: Matthew E Colburn, Hopewell Junction, NY (US); Satyanarayana V Nitta, Poughquag, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 10/804,553

(22) Filed: Mar. 19, 2004

(65) Prior Publication Data

US 2005/0208752 A1   Sep. 22, 2005

(51) Int. Cl.
*H01L 23/48* (2006.01)
*H01L 23/52* (2006.01)
*H01L 29/40* (2006.01)

(52) U.S. Cl. ............... 257/760; 257/750; 257/751; 257/758

(58) Field of Classification Search ........... 257/750, 257/758, 751, 760
See application file for complete search history.

(56) References Cited

OTHER PUBLICATIONS

Guarini et al., "*Optimization of Diblock Copolymer Thin Film Self-Assembly*", Advance Materials, vol. 4, No. 18, Sep. 16, 2002.
Black et al., "*Integration of Self-Assembled Diblock Copolymers for Semiconductor Capacitor Fabrication*", Applied Physics Letters, vol. 79, No. 3, Jul. 16, 2001.

*Primary Examiner*—Long Pham
(74) *Attorney, Agent, or Firm*—Ohlandt, Greeley, Ruggiero & Perle, L.L.P.; Daniel P. Morris, Esq.

(57) ABSTRACT

A method for fabricating a low k, ultra-low k, and extreme-low k multilayer interconnect structure on a substrate in which the interconnect line features are separated laterally by a dielectric with vertically oriented nano-scale voids formed by perforating it using sub-optical lithography patterning and etching techniques and closing off the tops of the perforations by a dielectric deposition step. The lines are supported either by solid or patterned dielectric features underneath. The method avoids the issues associated with the formation of air gaps after the fabrication of conductor patterns and those associated with the integration of conventional low k, ultra-low k and extreme low k dielectrics which have porosity present before the formation of the interconnect patterns.

14 Claims, 3 Drawing Sheets

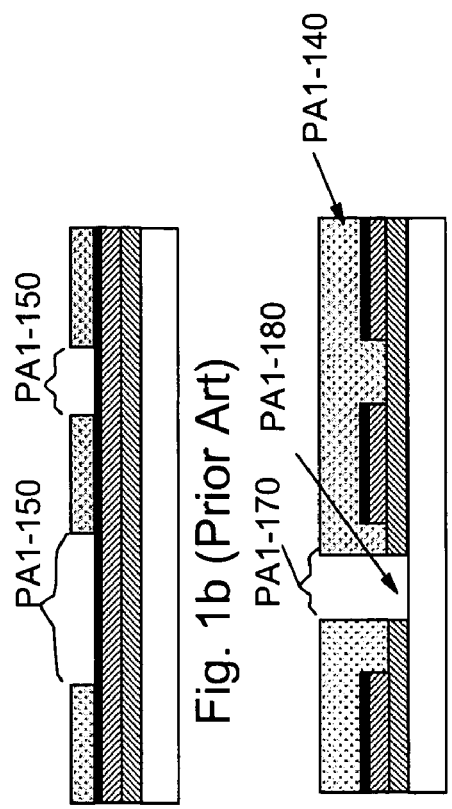
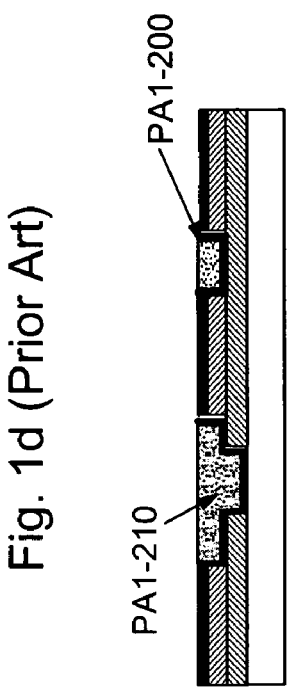
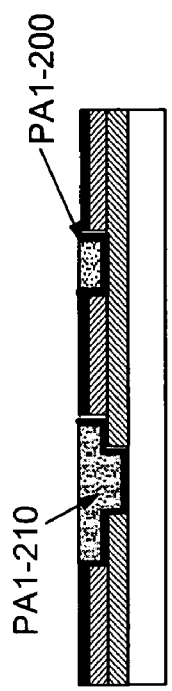
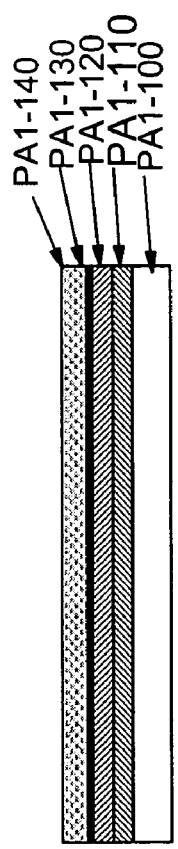
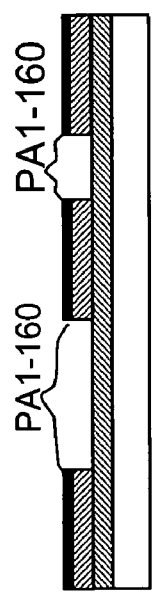
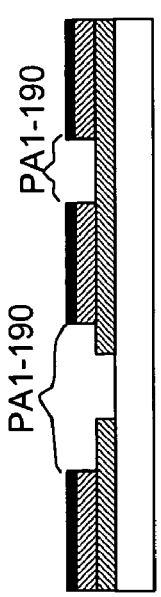

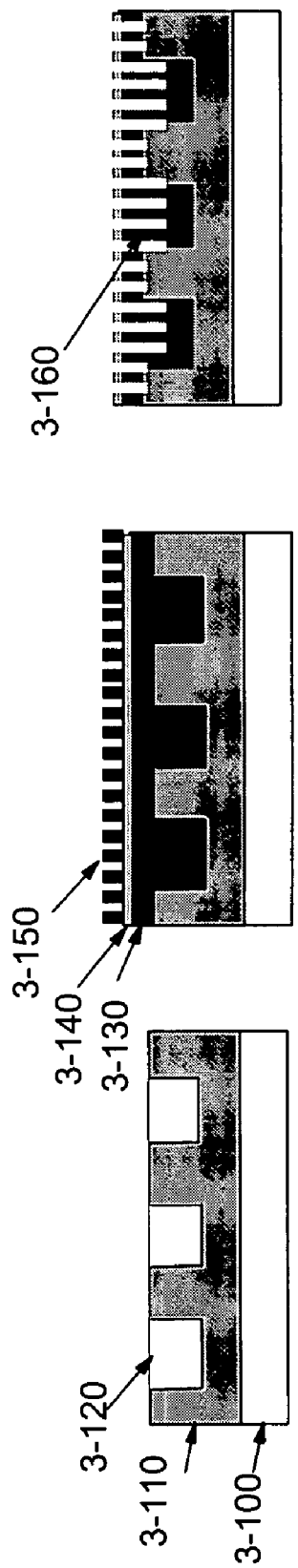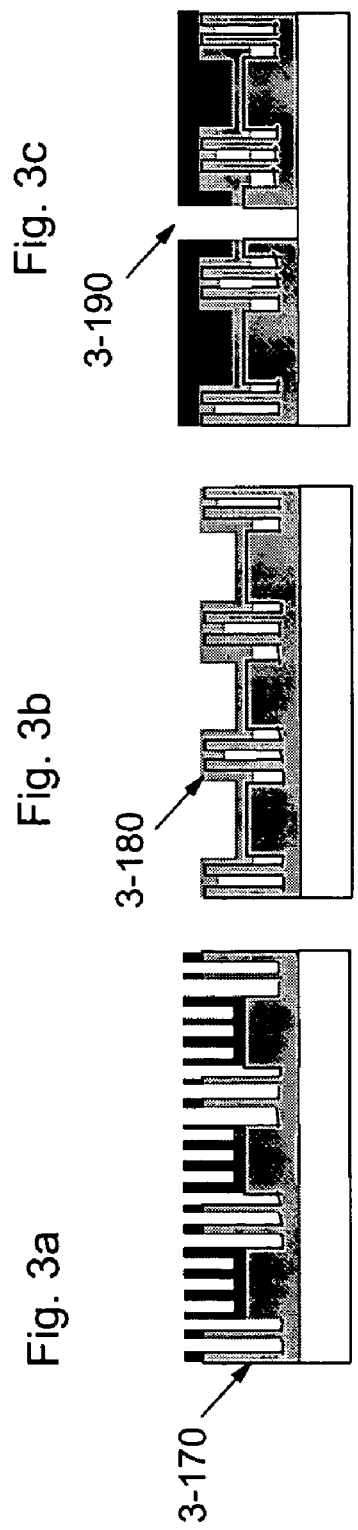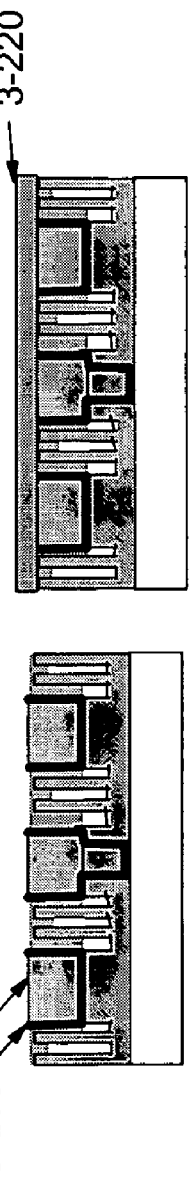

METHOD FOR FABRICATING A SELF-ALIGNED NANOCOLUMNAR AIRBRIDGE AND STRUCTURE PRODUCED THEREBY

BACKGROUND OF THE INVENTION

1. Field of the Invention

The present invention relates to a method of producing a nanocolumnar airbridge structure in a Very-Large Scale Integrated (VLSI) and Ultra-Large Scale Integrated (ULSI) device and high performance packaging. More particularly, the present invention relates to a nanocolumnar airbridge structure prepared by the method of the present invention.

2. Description of the Related Art

The fabrication of Very-Large Scale Integrated (VLSI) or Ultra-Large Scale Integrated (ULSI) circuit requires metallic wiring, which connects individual devices in a semiconductor chip to one another. One method of creating such wiring network on such a small scale is the dual damascene (DD) process known in the art as shown schematically in FIGS. 1a through 1g.

In a standard DD process, an interlayer dielectric (ILD), shown as two layers PA1-110, PA1-120 is coated on the substrate PA1-100, as shown in FIG. 1a. The via level dielectric PA1-110 and the line level dielectric PA1-120 are shown separately for clarity of the process flow description. In general, these two layers can be made of the same or different insulating films and in the former case applied as a single monolithic layer. A hard mask layer PA1-130 is optionally employed to facilitate etch selectivity and to serve as a polish stop as will be seen later.

The wiring interconnect network has two types of features: (1) line features that traverse a distance across the chip; and (2) via features, which connect lines in different levels together. Historically, both layers are made from an inorganic glass like silicon dioxide ($SiO_2$) or a fluorinated silica film deposited by plasma enhanced chemical vapor deposition (PECVD).

In the dual damascene process, the position of the lines PA1-150 and the vias PA1-170 are defined lithographically in photoresist layers, PA1-140, as depicted in FIGS. 1b and 1d, and transferred into the hard mask and ILD layers using reactive ion etching processes. The process sequence shown in FIGS. 1a through 1g is called a Line-first approach because the trench PA1-160 which will house the line feature is etched first, as shown in FIG. 1c. After the trench formation, lithography is used to define a via pattern PA1-170 in the photoresist layer PA1-140, which is transferred into the dielectric material to generate a via opening PA1-180, as shown in FIG. 1d.

The dual damascene trench and via structure PA1-190 is shown in FIG. 1e after the photoresist has been stripped. This structure PA1-190 is coated with a conducting liner material or material stack PA1-200, which serve to protect the conductor metal lines and vias. They also serve as an adhesion layer between the conductor and the ILD.

This recess is then filled with a conducting fill material PA1-210 over the surface of the patterned substrate. The fill is most commonly accomplished by electroplating of copper although other methods such as chemical vapor deposition (CVD) and other materials such as Al or Au can also be used. The fill and liner materials are then chemically-mechanically polished (CMP) to be coplanar with the surface of the hard mask. The structure at this stage is shown in FIG. 1f.

A capping material PA1-220 is deposited over the metal or as a blanket film, as depicted in FIG. 1g, to passivate the exposed metal surface and to serve as a diffusion barrier between the metal and any additional ILD layers to be deposited over them. Silicon nitride, silicon carbide, and silicon carbonitride films deposited by PECVD are typically used as the capping material PA1-220. This process sequence is repeated for each level of the interconnects on the device. Since two interconnect features are defined to form a conductor inlay within an insulator by a single polish step, this process is designated a dual damascene process.

As with any circuit, semiconductor chips are prone to signal propagation delays which depend on the product of the line resistance, R, and the interconnect capacitance, C. In order to improve the performance of semiconductor chips, manufacturers have reduced the resistivity of the metal used in fabrication by replacing aluminum wiring by copper. By moving to lower dielectric constant (k) materials, manufacturers have also begun to reduce the capacitance, C, in the circuit.

The common terminology used to describe the dielectric films is to classify them as standard k ($4.5<k<10$), low k ($k<3.0$), ultra low k ($2.0<k<2.5$) and extreme low k ($k<2.0$). Ultra low k and extreme low k dielectrics generally tend to be porous with intentionally engineered voids in their structure. Since the lowest dielectric constant possible is defined by air or vacuum ($k_{vac}=1$), many have developed means to produce voids in the dielectric. When the void volume extends and occupies substantial contiguous regions of the gaps between the lines one achieves an interconnect structure wherein the lines are nominally separated by a gas or vacuum as the ILD material. In the following descriptions the term air bridge is used to describe such an interconnect structure to distinguish it from structures wherein the ILD is porous with void volume dispersed randomly within a nominally contiguous solid dielectric.

One prior art approach to air bridge construction is shown in FIG. 2. In this process, a low-k structure is constructed after metal deposition steps to form the interconnects. For the purpose of reference, these types of processes are designated in the present application as Metal-then-Air Bridge (MAB) approaches consistent with the process sequence used.

Most processes that follow this approach begin with the standard DD fabrication sequence. Thus the process flow is consistent with FIGS. 1a through 1g. After the metallization step and before the cap layer deposition, a nanometer scale pattern is transferred into the underlaying interconnect structure and capped. Thus, for example, the structure shown in FIG. 2 is identical to the DD structure shown in FIG. 1f except the dielectric stack has nanocolumnar voids or pillars PA2-150 in the dielectric stack. Additional levels can then be fabricated in the same manner above the air bridge level.

One disadvantage of this approach is that exposure of the metallic line to harsh reactive ion etch processes is generally required in the step of patterning of the dielectric. Accordingly, an alternate approach that could circumvent the limitations of the MAB approaches would be highly desirable and beneficial in the fabrication of reliable multilevel air bridge structures.

The present invention provides such a method of producing a nanocolumnar airbridge structure in a Very-Large Scale Integrated (VLSI) and Ultra-Large Scale Integrated (ULSI) device and high performance packaging.

SUMMARY OF THE INVENTION

The present invention provides a method of producing a nanocolumnar airbridge structure including the steps of:

forming a layer of at least one dielectric on a surface of a substrate;

forming a set of line trenches, having a trench bottom surface in the dielectric layer, the closest ones of the line trenches being separated by a ground rule distance;

transferring a nanometer-scale pattern into the dielectric containing the line trenches;

depositing a bridge layer over the surface of the dielectric layer to form a mechanical link between adjacent lines;

forming a set of vias within the line trenches extending through the dielectric layer;

depositing the vias and line trenches with a liner layer;

filling the vias and line trenches with a conductive fill metal to form a set of metal lines;

planarizing the metal lines and the liner layers by polishing so that the metal is coplanar with the top of the bridge layer; and capping the metal lines with an electromigration and/or diffusion barrier to produce the nanocolumnar airbridge structure.

The present invention provides a nanocolumnar airbridge structure including:

a substrate;

at least one dielectric layer on a surface of the substrate;

a set of line trenches having a trench bottom surface in the dielectric layer, the closest ones of the line trenches being separated by a ground rule distance;

a nanometer-scale pattern transferred into the dielectric containing the line trenches;

a bridge layer deposited over the surface of the dielectric layer to form a mechanical link between adjacent lines;

a set of vias formed within the line trenches extending through the dielectric layer, the vias and the line trenches being lined with a liner layer and filled with a conductive fill metal to form a set of metal lines, wherein the metal lines and the liner layers are polished so that the metal is coplanar with the top of the bridge layer; and an electromigration and/or diffusion barrier for capping the metal lines.

These and other objects, features and advantages of the present invention as well as the preferred embodiments thereof and techniques for fabricating integrated circuit structures in accordance with the invention will become apparent from the following detailed description and the description of the drawings.

BRIEF DESCRIPTION OF THE DRAWINGS

FIG. 1 shows a schematic view of the steps in Dual Damascene (DD) Process.

FIG. 3a shows a structure in which the ILD is a monolithic dielectric on a substrate having already been patterned with a line trough.

FIG. 3b shows a structure, which is coated with a planarization layer, an etch hardmask, and a nanocolumnar patterning layer.

FIG. 3c shows a structure in which the nanocolumnar pattern is transferred from the patterning layer into the hardmask material and partly through the planarization layer.

FIG. 3d shows a structure in which the pattern is transferred all the way into the regions of ILD between the line trough pattern.

FIG. 3e shows a structure in which the hardmask and planarizing layer are removed and a conformal "bridge" layer is deposited over the structure.

FIG. 3f shows a structure in which the via pattern is transferred from the resist into the dielectric.

FIG. 3g shows a structure having metal lines and vias.

FIG. 3h shows a structure, which is capped with a diffusion and electromigration barrier.

DETAILED DESCRIPTION OF THE INVENTION

Figure 2:
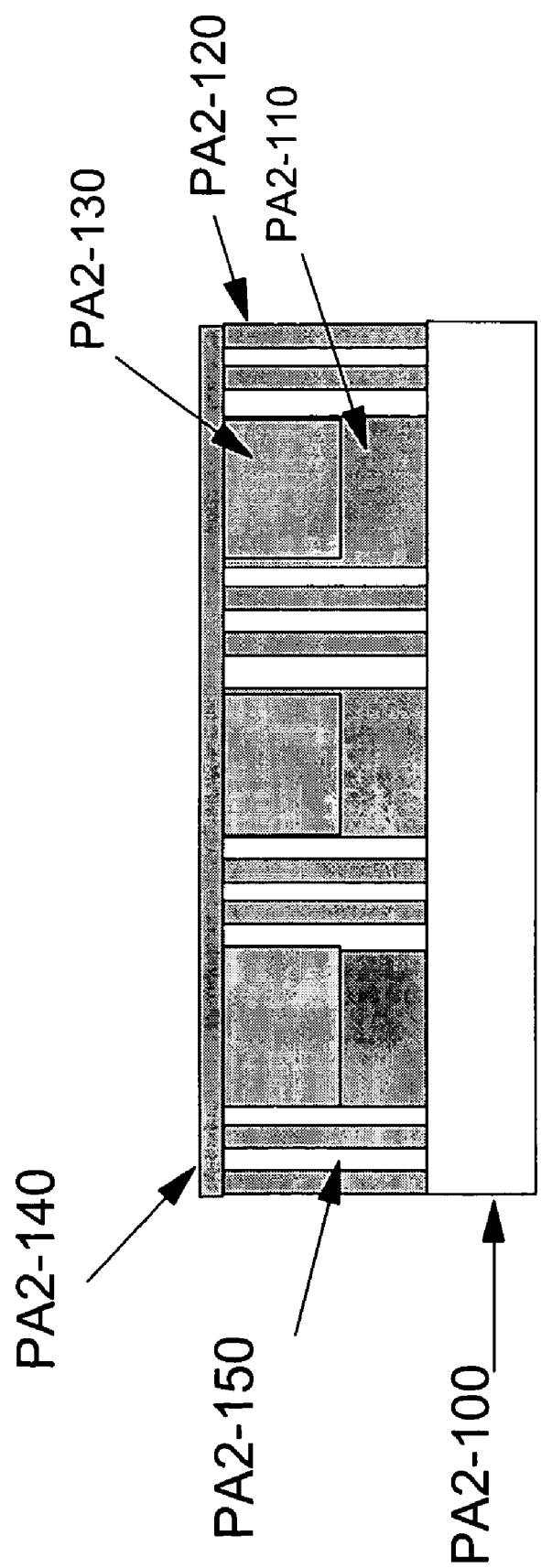
FIG. 2 shows a schematic view of a Nanocolumnar Air Bridge produced from Dual Damascene process post metallization according to the prior art.

This invention relates to a variety of extreme low k interconnect structures including a conductor that is encased in a dielectric medium, is supported transversely by a bridge member extending to an adjacent interconnect line and is supported vertically by vias and a dielectric support that is either continuous or patterned to lie only under the metal lines. The regions between the adjacent conductor lines are occupied either by nanocolumnar voids in a dielectric or by pillars of dielectric.

In the method of the present invention for fabricating a low k, ultra-low k, and extreme-low k multilayer interconnect structure on a substrate, the interconnects are separated laterally by an ILD that has nanocolumnar air gaps. The structure has a support layer in the via level of a dual damascene structure that is only under the metal line and the effective dielectric constant of a dielectric is decreased by perforating it using sub-optical lithography patterning techniques.

In a preferred embodiment, the nanocolumnar structure in the dielectric is generated between the troughs where the interconnect lines will be placed, a support dielectric layer provides structural rigidity and a deposited sidewall and bridge layer is formed before the formation of the conductor features, thereby forming a bridge layer between the tops of the conductors and a side wall passivation layer, respectively.

Referring to FIGS. 3a through 3h, structures produced in the stepwise preparation of a nanocolumnar airbridge structure according to the method of the present invention as part of the Air-Bridge-then-Metal (ABM) approach are shown. The method begins with the standard line first DD process steps but deviates prior to via transfer etch. The ILD can also be tailored to generate a variety of final structures.

FIG. 3a shows a structure in which the ILD is a monolithic dielectric 3-110 on a substrate 3-100 having already been patterned with a line trough 3-120.

FIG. 3b shows a structure, which is coated with a planarization layer 3-130, an etch hardmask 3-140, and a nanocolumnar patterning layer 3-150.

FIG. 3c shows a structure in which the nanocolumnar pattern is transferred from the patterning layer into the hardmask material and which is used as an etch mask for the transfer of the nanocolumnar pattern into a planarizing underlayer as shown in structure 3-160. As indicated in FIG. 3c, this pattern is not transferred through the depth of the trough, which is a feature that allows protection of the dielectric located under the trough region.

Referring to FIG. 3c, this pattern can alternatively be transferred to the bottom of the trough in the ILD if such protection is not desired.

Referring to FIG. 3d, the nanocolumnar pattern is then transferred into the dielectric regions between the trough features to form a nanocolumnar dielectric structure 3-170 between the trough. The nanocolumnar pattern can be transferred through the ILD fully or partially to achieve a tailored performance level.

If the alternative process from FIG. 3c is utilized, the corresponding nanocolumnar pattern can be transferred into the dielectric under the trough as well.

Referring to FIG. 3e, the hardmask and planarizing layer are then removed and a conformal layer 3-180, i.e., a bridge layer, is deposited over the structure closing the structure from the top and providing a coating that lines the sidewall of the trough. The conformal "bridge" layer closes off the nano-scale opening at the top surface and forms a mechanical linkage over the nanocolumnar structure, which provides a "closed engineered nanoporosity" prior to metallization. One or more dielectric coatings with different degrees of conformality of deposition can be used to achieve this end result. Additionally, the sidewall coating can act as a sealing layer that prevents processing ambients from encroaching into the ILD if it is porous or permeable; it can also prevent the ingress of species from use ambients (such as air or humidity) from degrading the interconnect features that will be located in the trough and via regions subsequently. The resulting structure is self aligned since there is no alignment required to generate the "engineered porosity" between the line troughs only. This is a result of the unique process sequence taught in the present inventive method.

FIG. 3f shows a structure in which the via pattern 3-190 is transferred from the resist into the dielectric. It can be seen from this figure that the line areas are again covered by a planarization layer during this step thus protecting the ILD from being perforated beneath the trough features.

FIG. 3g shows a structure in which the resist is stripped and the structure is lined with a conducting liner 3-200, filled with a highly conductive metal or alloy and polished back to generate the metal lines (and vias) 3-210.

FIG. 3h shows a structure, which is capped with a diffusion and electromigration barrier 3-220. If desired, additional levels can be built upon this structure.

The nanocolumnar pattern can be produced in several ways. The pattern can be formed lithographically, whether the imaging is carried out using electron beams, electron projection, x-rays, extreme ultraviolet radiation, ion beams, ion projection, or deep ultraviolet photons. Various technologies known to the art such as imprint lithography, soft lithography, nanocrystals such as CdSe and Si, self-assembly processes, spinoidal decomposition or phase separation of polymer blends, copolymers, block copolymers, or composites can also be used to form the holes. It is preferable that the feature size of the nanocolumnar pattern is smaller than the ground rule distance between the interconnect lines.

For example, poly(methyl methacrylate)-b-(polystyrene), poly(dimethylsiloxane)-b-(caprolactone), and other block copolymer or blend systems that phase separate can be used to produce a "self-patterned," i.e., holes isolated from one another, structure on the surface of the substrate.

One method of forming the nanocolumnar void pattern 3-150 shown in FIG. 3c is by selectively removing one component of a diblock copolymer structure and using the remaining phase as an etch mask to pattern the bridge layer. Using a diblock copolymer film that has phase separated, one phase of the film is selectively removed to leave a pattern with a regular array of holes that have nanometer scale dimensions, as described in C. T. Black, K. W. Guarini, K. R. Milkove, S. M. Baker, T. P. Russell, M. T. Tuominen, "Integration of Self-Assembled Diblock Copolymers for Semiconductor Capacitor Fabrication," Appl. Phys. Lett., 79, 409 (2001) and K. W. Guarini, C. T. Black, and S. Yeung, "Optimization of Diblock Copolymer Thin Film Self Assembly," Adv. Mat., 14, 1290 (2002).

These patterns can then be transferred into hard mask layers, the planarization layer, and the ILD stack, which can include a series of dielectric materials. In some circumstances the patterned polymer can be incorporated directly into the final structure if the polymer has sufficient thermal stability and mechanical robustness.

The dielectric layer material choices include organic dielectrics, such as, SiLK™; inorganic dielectrics, such as, silicon dioxide and fluorinated silicon dioxide; a class of PECVD low k dielectrics containing two or more of the following Si, C, O, F and H; spin on glasses, such as, methylsilsesquioxanes, hydrosilsequioxanes, and mixed silsesquioxanes; porous versions of any of these materials, and any combinations thereof. Also included in dielectric materials are hardmasks, polish stop layers, such as, hydrogenated silicon carbide, etch stop layers, such as hydrogenated silicon carbide, sacrificial layers, removable materials that can result in porosity in the ILD, referred to herein as porogens, and adhesion promoters.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

We claim:

1. A nanocolumnar airbridge structure comprising:
a substrate;
at least one dielectric layer on a surface of said substrate;
a set of line trenches having a trench bottom surface in said dielectric layer, the closest ones of said line trenches being separated by a ground rule distance;
a nanometer-scale pattern transferred into the dielectric containing said line trenches;
a bridge layer deposited over the surface of said dielectric layer to form a mechanical link between adjacent lines;
a set of vias formed within said line trenches extending through said dielectric layer, said vias and said line trenches being lined with a liner layer and filled with a conductive fill metal to form a set of metal lines, wherein said metal lines and said liner layers are polished so that the metal is coplanar with the top of said bridge layer; and
an electromigration and/or diffusion barrier for capping the top surfaces of said metal lines.

2. The nanocolumnar airbridge structure according to claim 1, wherein said nanometer scale pattern is an array of fine holes having diameters less than said ground rule distance in said dielectric layer.

3. The nanocolumnar airbridge structure according to claim 1, wherein said dielectric layer is one of: spin-on organosilicate film, CVD organosilicate film, silicon dioxide, fluorinated silicon dioxide, an organic dielectric, porous versions of any of the preceding materials, or any combinations thereof.

4. The nanocolumnar airbridge structure according to claim 1, wherein said nanometer scale pattern is formed using phase-separated polymers.

5. The nanocolumnar airbridge structure according to claim 1, wherein said nanometer scale pattern is formed using diblock copolymers.

6. The nanocolumnar airbridge structure according to claim 1, wherein said nanometer scale pattern is formed using a lithographic technique.

7. The nanocolumnar airbridge structure according to claim 1, wherein said lithographic technique is selected from the group consisting of: photolithography, electron beam lithography, x-ray lithography, interferometric lithography, extreme-ultra violet lithography, imprint lithography, embossing, and any combinations thereof.

8. The nanocolumnar airbridge structure according to claim 1, wherein said transfer of said nanometer scale pattern results in a dielectric having a nanometer scale pattern of holes or pillars only between the trough lines.

9. The nanocolumnar airbridge structure according to claim 1, wherein said transfer of said nanometer scale pattern results in a dielectric having a nanometer scale pattern of holes or pillars between the trough lines and under the trough lines.

10. The nanocolumnar airbridge structure according to claim 1, wherein said bridge layer on said nanometer scale patterned dielectric results in the formation of nanometer scale capped voids.

11. The nanocolumnar airbridge structure according to claim 1, wherein said bridge layer comprises a dielectric material.

12. The nanocolumnar airbridge structure according to claim 11, wherein said bridge layer is a multilayered structure comprising a combination of more than one dielectric material.

13. The nanocolumnar airbridge structure according to claim 1, wherein said bridge layer is a dielectric film having a dielectric constant less than 3.5.

14. The nanocolumnar airbridge structure according to claim 1, wherein said voids are vertically oriented.

* * * * *